(12) United States Patent
Vogelsang et al.

(10) Patent No.: US 12,375,109 B2
(45) Date of Patent: Jul. 29, 2025

(54) INTEGRATION OF COMPRESSION ALGORITHMS WITH ERROR CORRECTION CODES

(71) Applicant: Rambus Inc., San Jose, CA (US)

(72) Inventors: Thomas Vogelsang, Mountain View, CA (US); Michael Alexander Hamburg, 's-Hertogenbosch (NL); John Eric Linstadt, Palo Alto, CA (US); Evan Lawrence Erickson, Chapel Hill, NC (US)

(73) Assignee: Rambus Inc., San Jose, CA (US)

( * ) Notice: Subject to any disclaimer, the term of this patent is extended or adjusted under 35 U.S.C. 154(b) by 6 days.

(21) Appl. No.: 18/498,832

(22) Filed: Oct. 31, 2023

(65) Prior Publication Data

US 2024/0146336 A1 May 2, 2024

Related U.S. Application Data

(60) Provisional application No. 63/421,811, filed on Nov. 2, 2022.

(51) Int. Cl.
*H03M 13/00* (2006.01)
*H03M 13/15* (2006.01)

(52) U.S. Cl.
CPC ...... *H03M 13/6312* (2013.01); *H03M 13/159* (2013.01)

(58) Field of Classification Search
CPC ................................ H03M 13/6312
See application file for complete search history.

(56) References Cited

U.S. PATENT DOCUMENTS

| | | | |
|---|---|---|---|
| 4,730,321 A * | 3/1988 | Machado | G11B 20/1809 |
| 10,033,411 B2 | 7/2018 | Motwani | |
| 10,255,004 B2 | 4/2019 | Kang et al. | |
| 2004/0194008 A1 * | 9/2004 | Garudadri | H03M 13/29 714/821 |
| 2013/0042166 A1 * | 2/2013 | Anand | G06F 11/1048 714/E11.032 |
| 2013/0205183 A1 * | 8/2013 | Fillingim | G06F 11/108 714/773 |
| 2015/0188574 A1 * | 7/2015 | Yen | H03M 13/2906 714/755 |
| 2020/0293399 A1 * | 9/2020 | Steiner | G06F 11/1068 |
| 2021/0255808 A1 * | 8/2021 | Alameldeen | H03M 7/30 |

OTHER PUBLICATIONS

Kim, Jungrae et al., "Frugal ECC: Efficient and Versatile Memory Error Protection Through Fine-Grained Compression", SC'15, Nov. 15-20, 2015, Austin, TX, 2015 ACM, ISBN 978-1-4503-3723-6/15/11, DOI: http://dx.doi.org/10.1145/2807591.2807659. 12 pages.

* cited by examiner

*Primary Examiner* — Joseph D Torres
(74) *Attorney, Agent, or Firm* — Lowenstein Sandler LLP

(57) ABSTRACT

Systems and techniques that detect and correct failure of data storage and communication operations, including obtaining a first plurality of values, selecting a first plurality of error correction values to generate a first codeword, wherein the first codeword is associated with a plurality of syndrome values that encode a second subset of the first plurality of values, and causing a first processing device or a second processing device to restore the first plurality of values based on the first codeword.

20 Claims, 8 Drawing Sheets

INTEGRATION OF COMPRESSION ALGORITHMS WITH ERROR CORRECTION CODES

RELATED APPLICATIONS

This application claims the benefit of U.S. Provisional Patent Application No. 63/421,811, filed Nov. 2, 2022, entitled "INTEGRATION OF COMPRESSION ALGORITHMS WITH ERROR CORRECTION CODES," which is incorporated by reference herein.

TECHNICAL FIELD

The disclosure pertains to computing applications, more specifically to systems and techniques that improve reliability of recovering data that may be corrupted during data storage, retrieval, and communication.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1A:
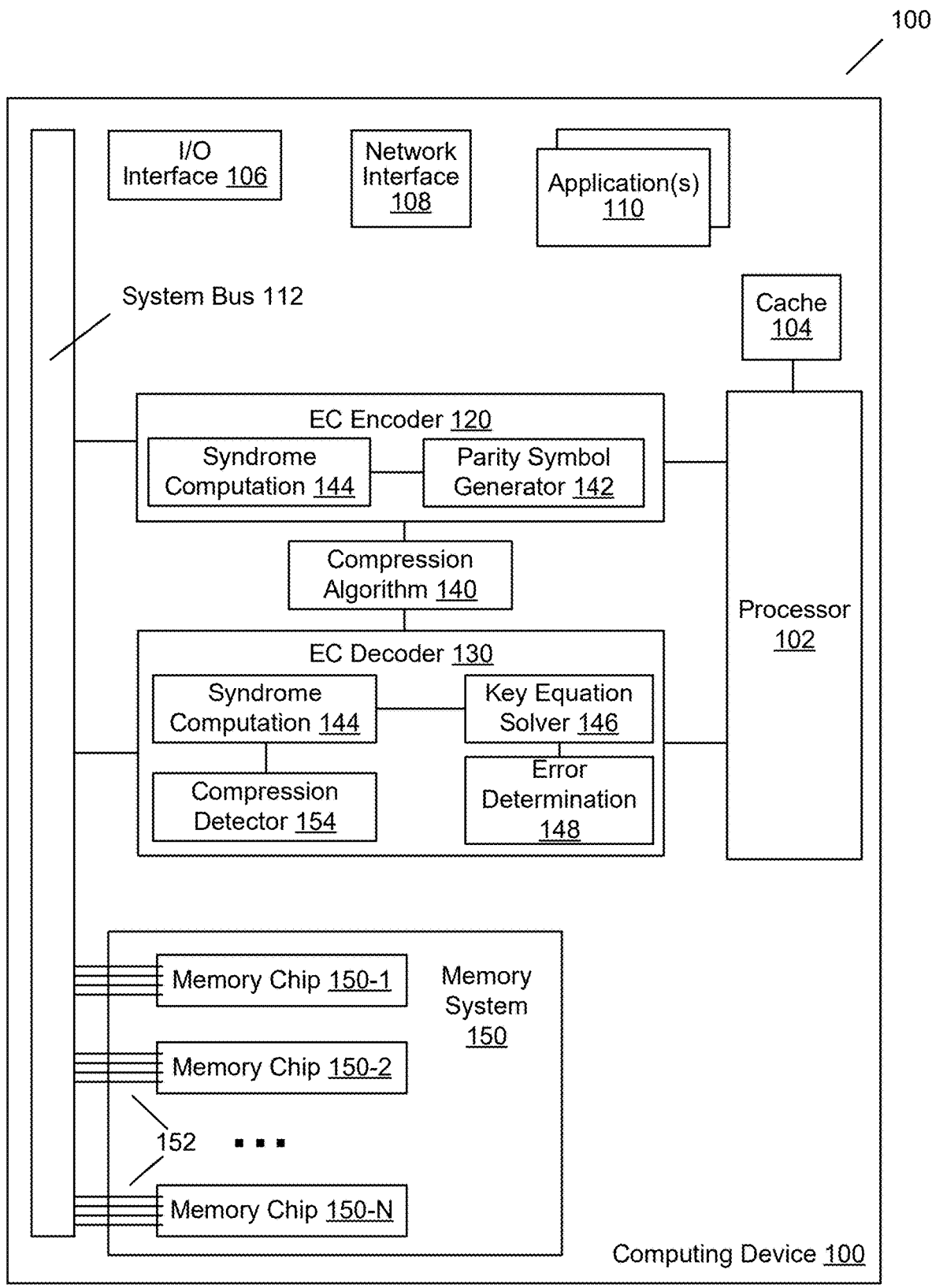
FIGS. 1A-B are block diagrams of an example computer system in which implementations of the present disclosure may operate.

Aspects and implementations of the present disclosure are related to systems and techniques that detect and correct failure of data storage and communication operations. Error correction (EC) techniques operate by storing data in conjunction with additional EC data (e.g., EC codes or parity symbols) that is redundant under ideal conditions but enables identifying parts of data that are lost in transmission or corrupted during write operations or storing of the data. In one non-limiting illustrative example, 32 symbols (e.g., bytes, double-bytes, etc.) of data may be stored in a memory device (or communicated over a network) together with 8 symbols of EC code for the data. In some secure memory systems, 40 symbols of a codeword (that includes both data and EC code) may be spread over multiple memory chips, so that a failure of any one chip does not result in irreversible loss of the data. For example, 10 chips may be used to store 32 symbols, with 8 chips storing 4 symbols of data each, and 2 additional chips may be used to store 4 EC symbols each. For speed of memory write and read operations, each chip may be accessed using multiple buses (channels), e.g., with 4 (or 2) channels per chip, so that each symbol (or a pair of symbols) is stored and accessed in a respective chip via a separate channel.

Such multi-chip memory systems enable reliable, secure, and fast (parallelized) memory accesses provided that the units of data being stored are limited to a certain number of data symbols or blocks corresponding to the number of access channels (e.g., 40 access channels to store the codeword). For some applications, it may be advantageous to store more data than 32 symbols at once, e.g., 33 symbols or more. In some instances, the data may be compressed down to 32 symbols (or less) so that the EC code may be applied in the usual manner. Sometimes, however, data compression may not succeed. In such instances, 33 symbols may be stored together with 7 EC symbols. A recipient (or a retriever) of the data may be unaware of whether the data is compressed and includes more EC symbols (e.g., 8) or is uncompressed and includes fewer EC symbols (e.g., 7). Storing (or transmitting) an indicator of the compression/EC mode takes additional storage space. On the other hand, trying out each of the two modes (compressed and uncompressed) wastes valuable computational resources and/or time. The disclosed implementations address this problem by providing for techniques of encoding the information about the compression/EC mode directly into EC symbols, as described in more detail below, and thus obviate the need to store a separate indicator of the mode.

Various codes of error correction may be used, including Reed-Solomon (RS) codes, Bose-Chaudhuri-Hocquenghem (BCH) codes, Hamming codes, and the like. More specifically, a message to be stored (or communicated) may include k symbols $m_0, m_1 \ldots m_{k-1}$ (e.g., k=32 in the above example), each symbol encoding an element of the Galois field $GF(2^q)$, e.g., polynomials of order q-1 with the addition (and subtraction) operations defined modulo 2 (bitwise XOR operations) and the multiplication (and division) operations defined modulo a suitably chosen irreducible polynomial of order q (e.g., q=8 for one-byte symbols). For example, the k-symbol message is mapped on the polynomial $m(x)=\Sigma_{j=0}^{k-1} m_j x^j$ in the Galois field $GF(2^q)$. To supplement the message with EC data, a generator polynomial may be formed, $g(x)=\Pi_{j=1}^{t}(x-a_j)$, which has t=n-k roots $a_1, a_2 \ldots a_t$ that are often chosen as powers of some primitive element d of the Galois field, e.g., $a_j=d^j$. The message polynomial m(x) may then be multiplied by $x^t$ (which can be performed via bit shifting) to make space for t error correction symbols, and the remainder polynomial r(x) of order t resulting from division of $m(x)x^t$ by the generator polynomial g(x) may be computed, $r(x)=m(x)x^t \bmod g(x)$. By construction, the combination $c(x)=m(x)x^t+r(x)$ is divisible by the generator polynomial g(x) and, therefore, inherits the t roots $a_1, a_2 \ldots a_t$ of the generator polynomial. The combination c(x) represents a codeword of n symbols that are stored in the memory (or communicated over network) in lieu of the k-symbol message m(x). The codeword c(x) may be associated with syndrome values that are used for error detection and/or correction.

After the codeword c(x) is stored and then retrieved from the memory (or, in network communications, after the codeword is transmitted and received by a target device) the stored (received) value s(x) of the codeword can be the same as the encoded codeword, s(x)=c(x) (uncorrupted value), or different from the encoded codeword, s(x)≠c(x) (corrupted value). A departure of the stored value s(x) from the encoded codeword c(x) may be quantified by evaluating the polynomial s(x) at each of the roots $a_1, a_2 \ldots a_t$, resulting in t syndrome values $S_j=s(a_j)$, which can be viewed as coefficients of a syndrome polynomial $S(x)=\Sigma_{j=0}^{t-1}S_{j+1}x^j$ of order t−1. Zero syndrome values, $\{S_j\}=0$, indicate that the stored codeword is the same as the encoded codeword, so that the message $m_0, m_1 \ldots m_{k-1}$ can be read as k most significant symbols of the codeword.

Nonzero values of some of the syndrome values $S_j$ indicate that one or more symbols of the codeword have been corrupted. Provided that the number of corrupted symbols is t/2 or less, the knowledge of syndrome values $S_j$ allows to identify and correct the corrupted symbols. More specifically, syndrome values $S_j$ may be used as coefficients in a key equation for an error locator polynomial Λ(x). Solution of the key equation yields the error locator polynomial Λ(x) whose roots may be used to identify locations of errors (e.g., specific corrupted symbols) and the values of those errors. The locations and values of the errors may then be used to determine an error polynomial, Δ(x), that being added to the stored codeword s(x) allows to recover the original (uncorrupted) codeword, c(x)=s(x)+Δ(x).

The techniques described above allow to identify a failure of any chip during storage of 32 symbols of data (e.g., in 8 chips with 4 symbols stored per chip) if t=8 EC symbols are stored (e.g., in 2 additional chips) in conjunction with the data and are used in techniques of checking and correcting errors in memory, e.g., in Chipkill™ technology. An EC code (40, 32) is then capable of detecting and correcting errors in any 4 (v=t/2=4) of 40 symbols, which can be symbols stored in the same chip. This allows, e.g., to detect failure of that entire chip.

In some applications, however, it can be advantageous to store additional (non-redundant) data in conjunction with the stored message, e.g., a metadata or some other data. For example, one or more additional symbols of data may need to be stored, leaving fewer symbols to store the EC data. For example, if 33 symbols of data are stored, only t=7 EC symbols are available for error detection and correction. An EC code (40, 33), which deploys the techniques described above, has a sub-threshold number (t<8) of EC symbols and can locate and correct only three errors while being able to detect four errors without correcting them. The existing techniques involve compressing the 33 symbols of data, using the additional space created by the compression for EC symbols, and storing a flag elsewhere (or transmitting the flag in a separate network communication) to indicate that the data is compressed, which results in additional overhead and sub-optimal utilization of processing (or network) resources.

Aspects of the present disclosure address the above noted and other challenges of the existing technology by enabling systems and techniques for utilizing EC symbols for additional data storage and as a flag indicating (un)compressed data. Two different EC codes may be used to achieve this result. For example, a weaker code (e.g., EC code (40, 33) with t=7 EC symbols) may be used in the instances of unsuccessful compression, and a stronger code (e.g., EC code (40, 32) with t=8 EC symbols) may be selected in the instances of successful compression (by at least one symbol, from 33 symbols to 32 symbols). It should be understood that the specific numbers of symbols are intended as a way of illustration and not limitation. It should be further understood that the disclosed techniques are not limited to specific EC algorithms and may be applied to any two EC codes that possess a subcode property, e.g., so long as the stronger code is a subcode of the weaker code. The subcode property should be understood in the following sense. The stronger code is a subcode of the weaker code if the weaker code's EC algorithm applied to a codeword produced by the stronger code allows correction up to the weaker code's threshold number of errors. In such instances, application of the weaker code will successfully restore the original codeword. For example, the EC code (40, 32) is a subcode of the EC code (40, 33) provided that a codeword produced by the EC code (40, 32) and corrupted by 3 errors or less can be corrected by the application of the EC code (40, 33).

Upon receiving data and non-zero metadata for storage (e.g., 32 symbols of data and 1 symbol of metadata), the data/metadata may be compressed, e.g., using a lossless compression algorithm. If compression has been unsuccessful and the length of the compressed data/metadata is greater than or equal to the length of the uncompressed data/metadata, the original uncompressed data may be selected as the message to encode. Thus, message m(x) containing 32 symbols of data may be used to generate the codeword c(x) using the stronger code, e.g., EC code (40, 32), with t=8 EC symbols. In order to additionally store the symbol of metadata, the remainder polynomial r(x) of the codeword c(x) may be selected such that t−1 syndrome values are zero and the remaining syndrome value is equal to the metadata symbol M, e.g., $S_j=0$ for j=1 ... t−1, and $S_t=M$. Thus, by modifying the remainder polynomial generated by the stronger code, the resulting codeword is a valid codeword of the weaker code (due to the subcode property) but not the stronger code.

If compression has been successful and the length of the compressed data/metadata (e.g., 32 symbols or less) is less than the length of the uncompressed data/metadata (e.g., 33 symbols), the data/metadata may be selected as the message to encode. Thus, message m(x) may be the 32 symbols of compressed data and metadata. To generate the codeword c(x), the stronger code, e.g., EC code (40, 32) may be used with t=8 EC symbols. Because there is no additional data to store, the remainder polynomial r(x) of codeword c(x) may be selected using the stronger code such that all t syndrome values are zero, $S_j=0$ for j=1 ... t.

In both scenarios, after the message m(x) and remainder polynomial r(x) have been selected, codeword $c(x)=m(x)x^t+r(x)$ may be stored (or transmitted). When codeword c(x) is received (possibly as a corrupted codeword s(x)), the syndrome values may be computed as described above, the key equation may be constructed using the computed syndrome values, and the error locator polynomial can be obtained as the solution of the key equation and used to determine the number of errors present in the retrieved (or received) codeword s(x). If the number of errors in the codeword s(x) is equal to or less than the EC threshold of the weaker code, the weaker code may be used to correct any errors in s(x) and recover the corrected (restored) codeword c(x). The syndrome values recomputed for the corrected codeword c(x) then determine whether the original data/metadata were compressed or not. If all t recomputed syndrome values are zero, the message/metadata were compressed. Thus, the message m(x) may be uncompressed to extract both the original data and the metadata. If t−1 syndrome values are zero and the remaining (e.g., tth) syndrome value is nonzero, the message m(x) was not compressed and is given by k most significant symbols of the corrected codeword c(x) while the metadata is given by the non-zero syndrome value, e.g., $S_t=M$.

If the number of errors present in retrieved (received) codeword s(x) is more than the EC threshold of the weaker code, the stronger code may be used to correct errors in s(x). If the stronger code fails to correct s(x) to produce c(x), an occurrence of an unrecoverable error may be declared. If the stronger code succeeds in correcting s(x) to produce c(x), it is known that the message m(x) was compressed. Thus, the message m(x) may be uncompressed to extract both the original data and the metadata. In some instances, the application of the stronger code may be conditional on the output of the application of the weaker code. For example, the application of the weaker EC code (40, 33) may allow detecting an occurrence of four errors (while being able to correct only three).

Correspondingly, if the application of the weaker code indicates presence of four errors, the stronger code may then be applied. If the application of the weaker code indicates presence of more than four errors, the stronger code may not be applied, and an unrecoverable error may be declared.

The advantages of the disclosed techniques include but are not limited to multi-mode storage of compressed and uncompressed data using error correcting codes. The disclosed techniques allow storing (transmitting) compressed data with a high error correction threshold when compression is possible, while also allowing storage (transmission) of uncompressed data with a slightly lower error correction threshold without the need to store a separate flag indicating the state of compression.

System Architecture

FIG. 1A is a block diagram illustrating an example computing device 100 in which implementations of the present disclosure may operate. Computing device 100 may be any desktop computer, a tablet, a smartphone, a server (local or remote), a thin/lean client device, a server, a cloud computing node, an edge device, a network switch, a gateway device, a card reader, a wireless sensor node, an Internet-of-Things (IoT) node, an embedded system dedicated to one or more specific applications, and so on. Computing device 100 may have one or more processors 102, e.g., central processing units (CPUs), graphics processing units (GPUs), field-programmable gate arrays (FPGA), application-specific integrated circuits (ASICs), and the like. "Processor" refers to a device capable of executing instructions encoding arithmetic, logical, or I/O operations. In one illustrative example, a processor may follow the von Neumann architectural model and may include one or more arithmetic logic units (ALUs), a control unit, and may further have access to a plurality of registers, or a cache 104.

Processor 102 may include one or more processor cores. In implementations, each processor core may execute instructions to run a number of hardware threads, also known as logical processors. Various logical processors (or processor cores) may be assigned to one or more processes supported by processor 102, although more than one processor core (or a logical processor) may be assigned to a single processor for parallel processing. A multi-core processor may simultaneously execute multiple instructions. A single-core processor may typically execute one instruction at a time (or process a single pipeline of instructions).

Computing device 100 may include one or more memory systems 150. The memory system 150 may refer to any volatile or non-volatile memory and may include a read-only memory (ROM), a random-access memory (RAM), electrically erasable programmable read-only memory (EEPROM), flash memory, flip-flop memory, or any other device capable of storing data. RAM may be a dynamic random-access memory (DRAM), synchronous DRAM (SDRAM), a static memory, such as static random-access memory (SRAM), and the like. In some implementations, processor(s) 102 and memory system 150 may be implemented as a single controller, e.g., as an FPGA. Memory system 150 may include multiple memory chips 150-1 . . . 150-N. In some implementations, memory chips 150-1 . . . 150-N may be accessed via memory channels 152 that allow simultaneous write (store) and read (load) operations, e.g., simultaneous storing and/or reading of multiple data symbols.

Computing device 100 may further include an input/output (I/O) interface 106 to facilitate connection of the computing device 100 to various peripheral hardware devices (not shown in FIG. 1A) such as card readers, terminals, printers, scanners, IoT devices, and the like. Computing device 100 may further include a network interface 108 to facilitate connection to a variety of networks (Internet, wireless local area networks (WLAN), personal area networks (PAN), public networks, private networks, etc.), and may include a radio front end module and other devices (amplifiers, digital-to-analog and analog-to-digital converters, dedicated logic units, etc.) to implement data transfer to/from computing device 100. Various hardware components of the computing device 100 may be connected via a system bus 112 that may include its own logic circuits, e.g., a bus interface logic unit (not shown in FIG. 1A).

Computing device 100 may support one or more applications 110. Application(s) 110 supported by computing device 100 may include machine-learning application(s), graphics application(s), computational application(s), cryptographic application(s) (such as authentication, encryption, decryption, secure storage application(s), etc.), embedded application(s), external application(s), or any other types of application(s) that may be executed by computing device 100. Application(s) 110 may be instantiated on the same computing device 100, e.g., by an operating system executed by the processor 102 and residing in the memory system 150. Alternatively, the external application(s) may be instantiated by a guest operating system supported by a virtual machine monitor (hypervisor) operating on the computing device 100. In some implementations, the external application(s) may reside on a remote access client device or a remote server (not shown), with the computing device 100 providing computational support for the client device and/or the remote server.

Computing device 100 may include an error correction (EC) encoder 120 that may receive, from processor 102, a data message to be stored in memory system 150 or transmitted over network interface 108. EC encoder 120 may use a compression algorithm 140 to implement compression of the data message. Based on the length of the compressed message (e.g., depending on whether the compressed message is shorter than the uncompressed message or not), EC encoder 120 may provide part of the data message to syndrome computation 144, which may generate target syndrome values. EC encoder 120 may include a parity symbol generator 142 that generates a codeword encoding the data message based on the target syndrome values of syndrome computation 144 (as described above). The codeword may include one or more EC (parity) symbols. The codeword encoding the data message may be stored in memory system 150, e.g., in one or more memory chips 150-1-150-N, or transmitted over network interface 108.

Computing device 100 may include an EC decoder 130 to perform inverse operations of decoding codewords retrieved from memory system 150 or received via network interface 108. EC decoder 130 may include syndrome computation 144 that calculates syndrome values based on the received codeword. EC decoder 130 may include a key equation solver 146 that determines, based on the calculated syndrome values, how many errors are present in the received codeword. Error determination 148 may then identify, based on the solution of the key equation, the locations and values of the errors in the received codeword. After the received codeword has been corrected, EC decoder 130 may again compute syndrome values (e.g., by using syndrome computation 144). EC decoder 130 may include compression detector 154 that determines based on the recomputed syndrome values whether the message encoded in the received codeword was compressed, as described above. For example, if all recomputed syndrome values are zero, compression detector 154 may determine that the message was compressed.

Correspondingly, compression algorithm 140 may uncompress (decompress) the message and provide the uncompressed message to a host (e.g., owner of data) via system bus 112. If the message was not compressed, EC decoder 130 may combine the message values and any non-zero syndrome values as the message to the host via system bus 112.

Any functions or components depicted as part of EC encoder 120 and/or EC decoder 130 may be implemented via dedicated hardware circuits configured to perform one or more computational operations (e.g., multiplication, addition, inversion, division, differentiation, and the like), or as software modules executed on any suitable processor (e.g., processor 102), or as any combination of dedicated hardware circuits and software modules.

Figure 1B:
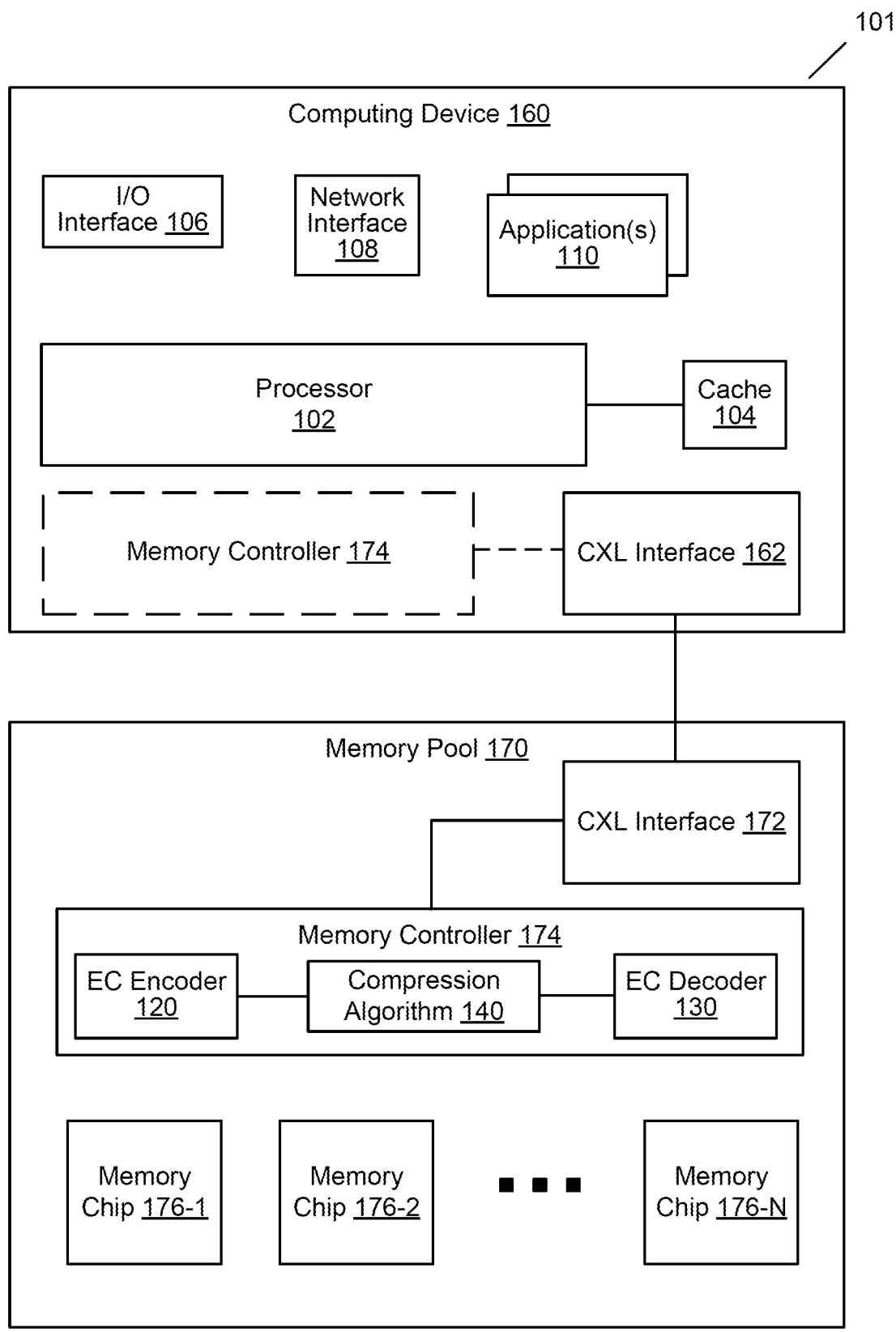

FIG. 1B is a block diagram illustrating another example computing architecture 101 in which implementations of the present disclosure may operate. Example computing architecture 101 may include a computing device 160 and a memory pool 170, which may be hosted by a separate device. Various components and modules identified in FIG. 1B with the same numerals as corresponding components and modules of FIG. 1A, may have the same or a similar functionality.

In some implementations, computing device 160 may be connected to a memory pool 170 via a Compute Express Link (CXL®) or some other suitable interconnect that facilitates high-speed processor-to-memory connections. For example, computing device 160 may include a CXL interface 162 connected to a CXL interface 172 of memory pool 170. In some implementations, memory pool 170 may include a memory controller 174 responsible for compressing, encoding, and decoding data that is written to and read from memory. In some implementations, as illustrated schematically with the dashed box, memory controller 174 may be included in computing device 160. Memory controller 174 may include EC encoder 120, compression algorithm 140, and EC decoder 130, which may operate in the same manner as corresponding components of FIG. 1A. In some implementations, both computing device 160 and memory pool 170 may include a memory controller 174. In some implementations, memory controller 174 of computing device 160 may be responsible for compressing and encoding data and memory controller 174 of memory pool 170 may be responsible for decompressing and decoding data, or vice versa. Memory pool 170 may refer to any volatile or non-volatile memory and may include ROM, RAM, EEPROM, flash memory, flip-flop memory, or any other device capable of storing data. RAM may be DRAM, SDRAM, a static memory, such as SRAM, and the like. Memory pool 170 may include memory chips 176-1 . . . 176-N.

Conditional Compression and Encoding of Data

Figure 2A:
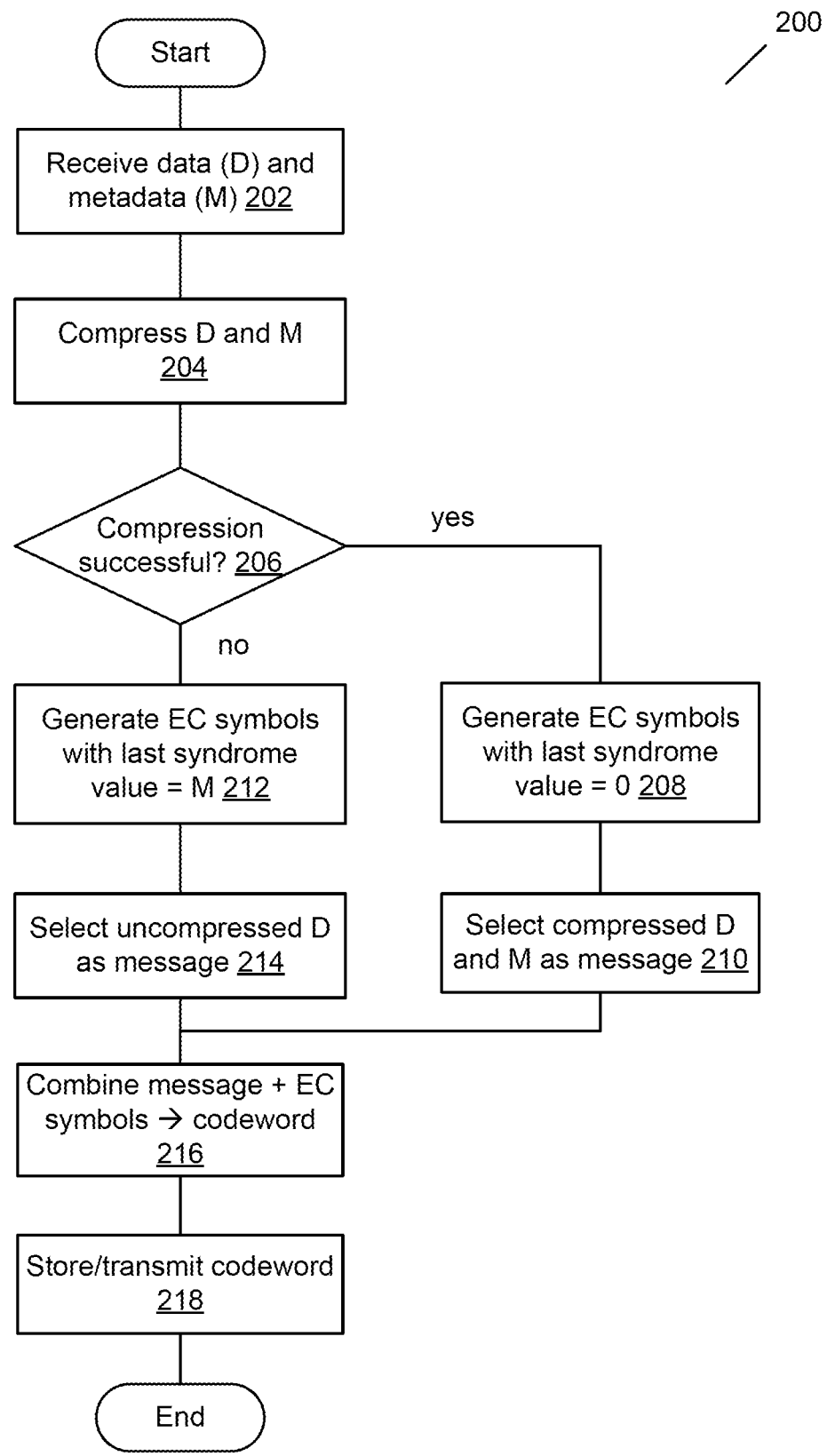
FIG. 2A is a flowchart illustrating operations of conditional compression and encoding of data using error correcting codes, in accordance with some aspects of the present disclosure.

FIG. 2A is a flowchart illustrating operations 200 of conditional compression and encoding of data using error correcting codes, in accordance with some aspects of the present disclosure. In some implementations, operations 200 may be performed by EC encoder 120 and compression algorithm 140 of FIG. 1A. At block 202, data and metadata may be received. Although the reference throughout this disclosure is made to metadata for brevity and conciseness, the metadata should be understood as any additional data that may be stored or transmitted in lieu of one or more EC symbols that are conventionally generated as part of a storage or transmission operation. The data and metadata may then be compressed, at block 204. At decision block 206, EC encoder 120 performing operations 200 may test whether compression has been successful and the length of the compressed data/metadata is at least one symbol shorter than the length of the uncompressed data/metadata. If compression has been successful, at block 208, EC encoder 120 may generate EC symbols (e.g., parity symbols) such that all syndrome values of the generated codeword equal zero (e.g., using the stronger EC code, as discussed above). At block 210, EC encoder 120 may then select the compressed data/metadata as the message to store and/or transmit together with the EC symbols (as the codeword). If compression has not been successful and the length of the compressed data/metadata is the same (or larger) than the length of the uncompressed data/metadata, at decision block 206, EC encoder 120 may perform operations of block 212, which may generate EC symbols such that one or more syndrome values at predetermined positions (e.g., the last syndrome value, the first syndrome value, and so on) of the generated codeword equals the one or more symbols of the metadata. At block 214, EC encoder 120 may then select the uncompressed data as the message to encode. At block 216, EC encoder 120 may generate the codeword by combining the selected message and the generated EC symbols, and, at block 218, write the codeword to memory (or transmit the codeword over a network).

FIB. 2B is a flowchart illustrating operations 250 of conditional decompression and decoding of data using error correcting codes, in accordance with some aspects of the present disclosure. In some implementations, operations 250 may be performed by EC decoder 130 and compression algorithm 140 of FIG. 1A. At block 252, a codeword that includes a message and EC (parity) symbols may be received. Syndrome values for the codeword may be computed at block 254. Based on the syndrome values, the number, locations, and values of errors present in the codeword may be determined at block 256. At decision block 258, EC decoder 130 may test whether the number of errors present in the received codeword is less than or equal to an EC code's correction threshold (e.g., the Reed-Solomon correction threshold of the weaker code EC (40, 33) with t=7 may be [t/52]=3). If the number of errors does not exceed the correction threshold, at block 260, EC decoder 130 may correct the errors in the codeword. Then at block 262, EC decoder 130 may recalculate the syndrome values, this time using the corrected codeword. At decision block 264, EC decoder 130 may determine whether the message in the codeword was compressed based on the syndrome values. If the message was compressed (e.g., all recalculated syndrome values are zero), at block 268, the message of the received codeword may be uncompressed using compression algorithm 140 to extract the original data and metadata. If the message was not compressed (the syndrome values at predetermined positions are non-zero, e.g., the last position), at block 270, the message portion of the corrected codeword (which contains the original data) and the non-zero syndrome value(s) (as the metadata) may be provided to the host (block 280).

On the other hand, if at decision block 258 it is determined that the number of errors present in the received codeword is greater than the correction threshold of the EC code, at block 272, EC decoder 130 may attempt to correct one additional error in the codeword (e.g., correcting the codeword with the stronger code instead of the weaker code, as discussed above). At decision block 274, EC decoder 130 may test whether the codeword was successfully corrected by the stronger code. If correction was successful, at block 268, the message portion of the corrected codeword may be uncompressed using compression algorithm 140 to obtain the original data and metadata. If the codeword was not successfully corrected, at block 278, EC decoder 130 may declare an uncorrectable error. After the data and metadata have been obtained, at block 280, both the data and the metadata may be provided to the host (e.g., the requesting processor or device).

Figure 3A:
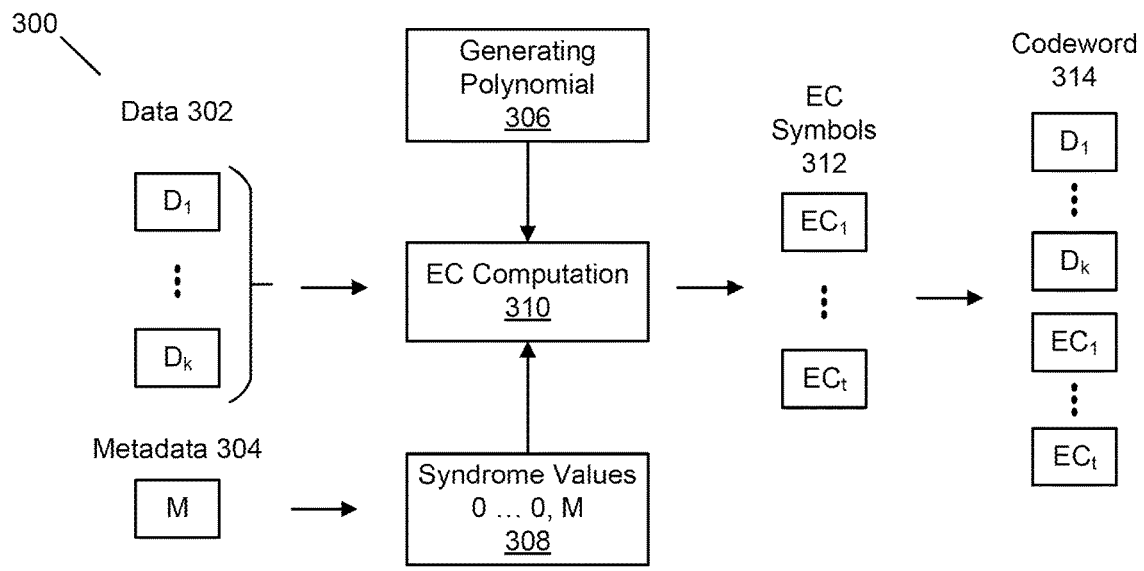
FIG. 3A is a schematic illustration of an error correction encoding of uncompressed data, in accordance with some implementations of the present disclosure.

FIG. 3A is a schematic illustration of an error correction encoding 300 of uncompressed data, in accordance with some implementations of the present disclosure. In some implementations, EC encoding 300 may correspond to blocks 212, 214, and 216 of FIG. 2A. Data 302 may include one or more symbols $D_1, \ldots, D_k$. Metadata 304 may include one or more symbols M (one metadata symbol is shown for conciseness). EC (parity) symbols 312 may be generated based on data 302 using generating polynomial 306. EC symbols 312 may be generated such that metadata 304 is encoded in syndrome values 308. For example, codeword 314 may include k symbols $D_1, \ldots, D_k$ and t EC symbols $EC_1 \ldots EC_t$:

$$c(x) = x^t \sum_{j=1}^{k} D_j x^{j-1} + \sum_{l=1}^{t} EC_l x^{l-1}.$$

Syndrome values 308 may include values of the codeword at a set of points $a_1 \ldots a_t$ (which may be roots of generating polynomial 306). EC computation 310 may generate t EC symbols 312 $EC_1 \ldots EC_t$ selected to satisfy suitably chosen t equations, e.g., in one non-limiting example implementation, $$c(a_l)=0, l=1 \ldots t-1,$$

$$c(a_t)=M.$$

In some implementations, solution of these (or similar) equations may involve computing a matrix multiplication product, $(EC_1 \ldots EC_t)^T = A(\{a_l\}) \cdot (D_1, \ldots, D_k, M)^T$, where $A(\{a_l\})$ is a precomputed encoding matrix that depends on the set of parameters $a_l$ (e.g., roots of the generator polynomial) and has dimensions t×(k+1), if the metadata occupies one symbol or t×(k+s) if metadata occupies s symbols. As a result, the generated EC symbols 312 together with data 302 are combined into codeword 314 whose syndrome values encode metadata 304.

Figure 2B:
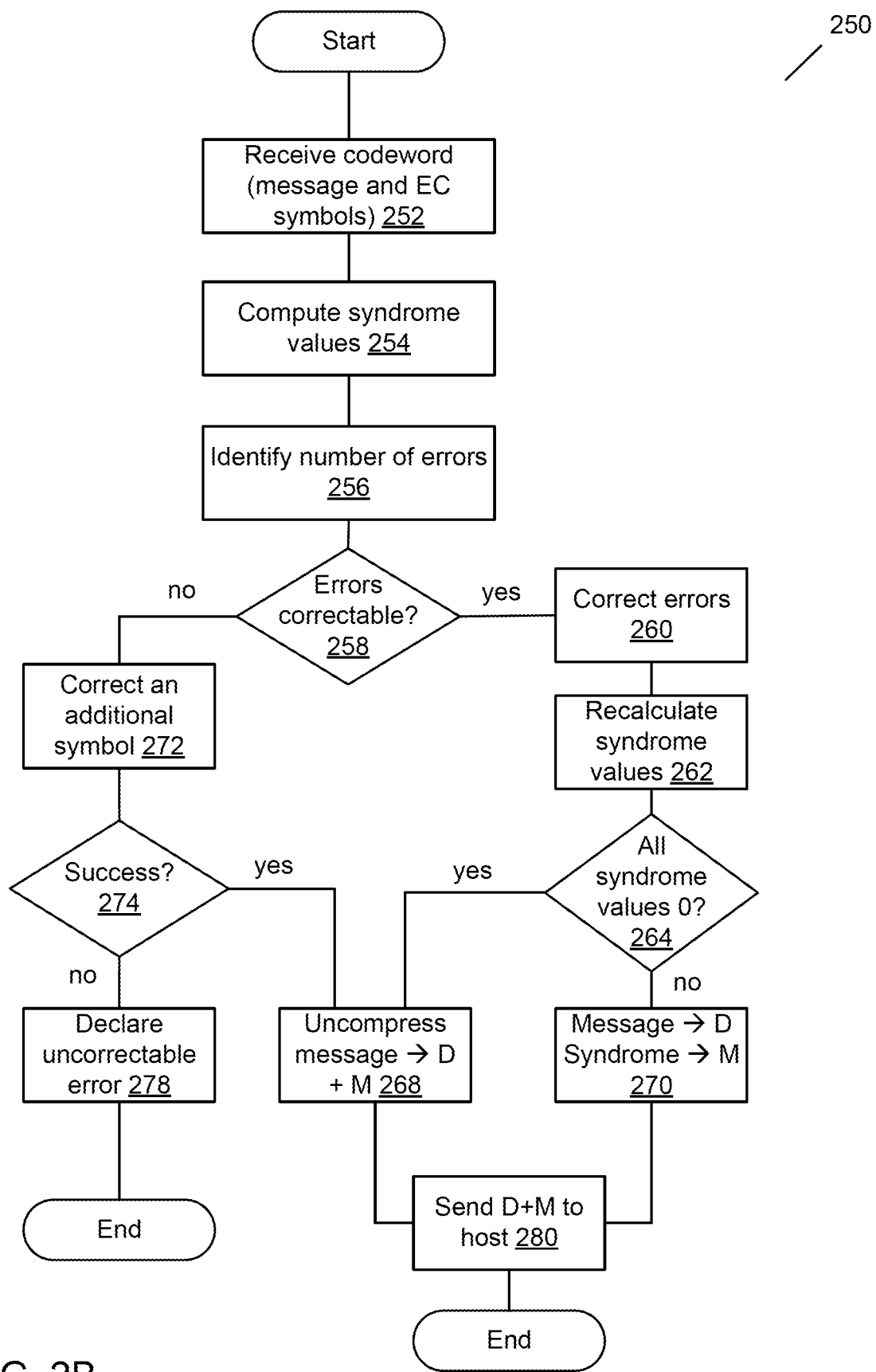
FIG. 2B is a flowchart illustrating operations of conditional decompression and decoding of data using error correcting codes, in accordance with some aspects of the present disclosure.
Figure 3B:
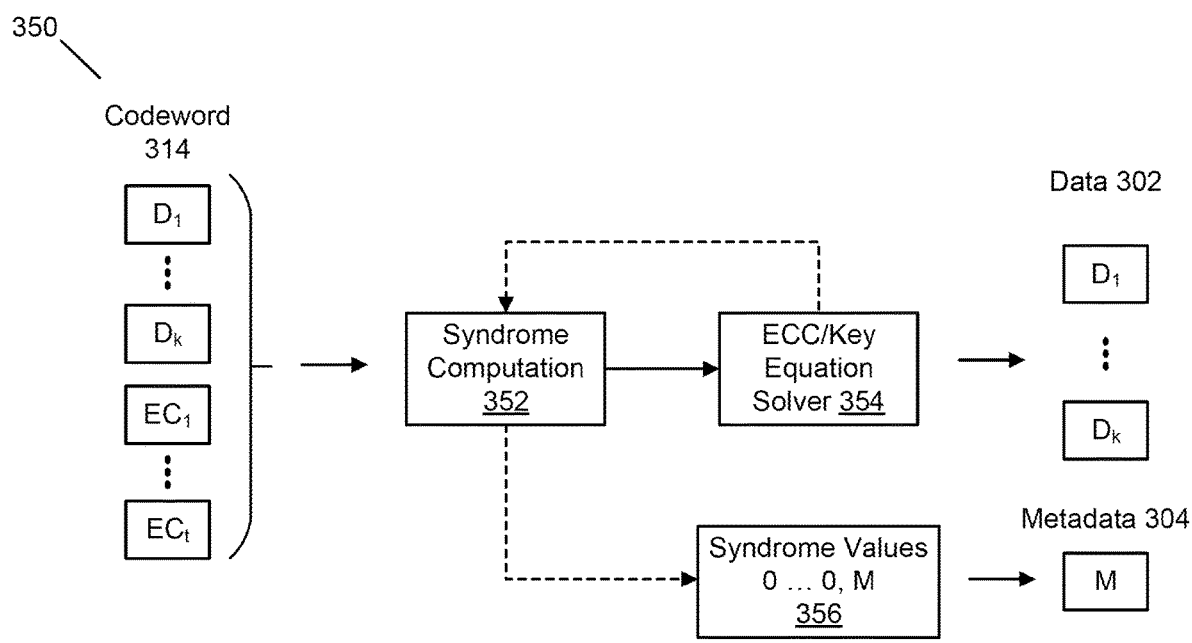
FIG. 3B is a schematic illustration of an error correction decoding of uncompressed data, in accordance with some implementations of the present disclosure.

FIG. 3B is a schematic illustration of an error correction decoding 350 of uncompressed data, in accordance with some implementations of the present disclosure. In some implementations, operations 350 may correspond to blocks 254, 256, 260, 262, and 270 of FIG. 2B. In some implementations, codeword 314 of FIG. 3B may be the same as codeword 314 of FIG. 3A. In some implementations, codeword 314 of FIG. 3B may have one or more symbols that are different than the symbols of codeword 314 of FIG. 3A. The syndrome values of codeword 314 (e.g., values $c(a_l)$ for l=1 ... t) may be calculated at syndrome computation 352. In some implementations, syndrome values $S_1 \ldots S_t$ may be calculated using matrix multiplication, e.g., $(S_1 \ldots S_t)^T = B(\{a_l\}) \cdot (D_1, \ldots, D_k, EC_1 \ldots EC_t)^T$, where $B(\{a_l\})$ is a precomputed t×(k+t) matrix. Based on the syndrome values, ECC/key equation solver 354 may correct errors in codeword 314 (as described above). After errors have been corrected, syndrome computation 352 may recalculate syndrome values 356 of the corrected codeword (as illustrated schematically with the dashed arrows). Syndrome values 356 may include the original metadata 304, and the corrected codeword may include the original data 302.

In some implementations, other techniques that indicate compression (or lack thereof) and/or the specific EC code applied during encoding the data may be used in addition to or instead of the techniques disclosed above. In some implementations, a flag indicating that the codeword contains compressed data may be stored in a suitable location. In one implementation, the flag may be stored outside of the encoded data, e.g., in a trusted memory, a page table, or the like. Depending on the value of the flag fetched during a read operation from the trusted location, EC decoder 130 may determine which EC code (e.g., the stronger code or the weaker code) is to be applied to the data (and, correspondingly, whether the data is compressed or not). In some implementations, the flag may be stored together with the data or metadata. For example, one or more bytes or bits that are used to store the EC symbols may be reserved to store a flag indicating compression of the encoded data. A process may be established to handle a possibility that a flag itself can become corrupted. More specifically, in one implementation, the process may include assuming that the flag's value has not been corrupted and perform EC decoding in accordance with a first EC code indicated by the flag's value (and perform decompression, if the first EC code is the stronger code). Provided that the EC decoding has been successful, the process may stop. If the EC decoding is unsuccessful, EC decoder 130 may then assume that the flag's value has been corrupted and select the second EC code. EC decoder 130 may perform EC decoding according to the second EC code (and may further perform decompression, if the second EC code is the stronger code). Provided that the EC decoding has been successful, the process may stop. If the EC decoding is again unsuccessful, EC decoder 130 may declare an uncorrectable error.

In some implementations, determination of which EC code is to be applied to the data (and whether the data is compressed or not) may be made based on the address (stored in a memory access table, e.g. page table) used to store the data, with the compressed data stored in a first plurality of addresses and uncompressed data stored in a second plurality of addresses.

In some implementations, EC decoder 130 may attempt to apply multiple EC codes (e.g., the weaker code and the stronger code) to the codeword in parallel (or consecutively) with the EC code that successfully decodes the codeword being selected.

Figure 4:
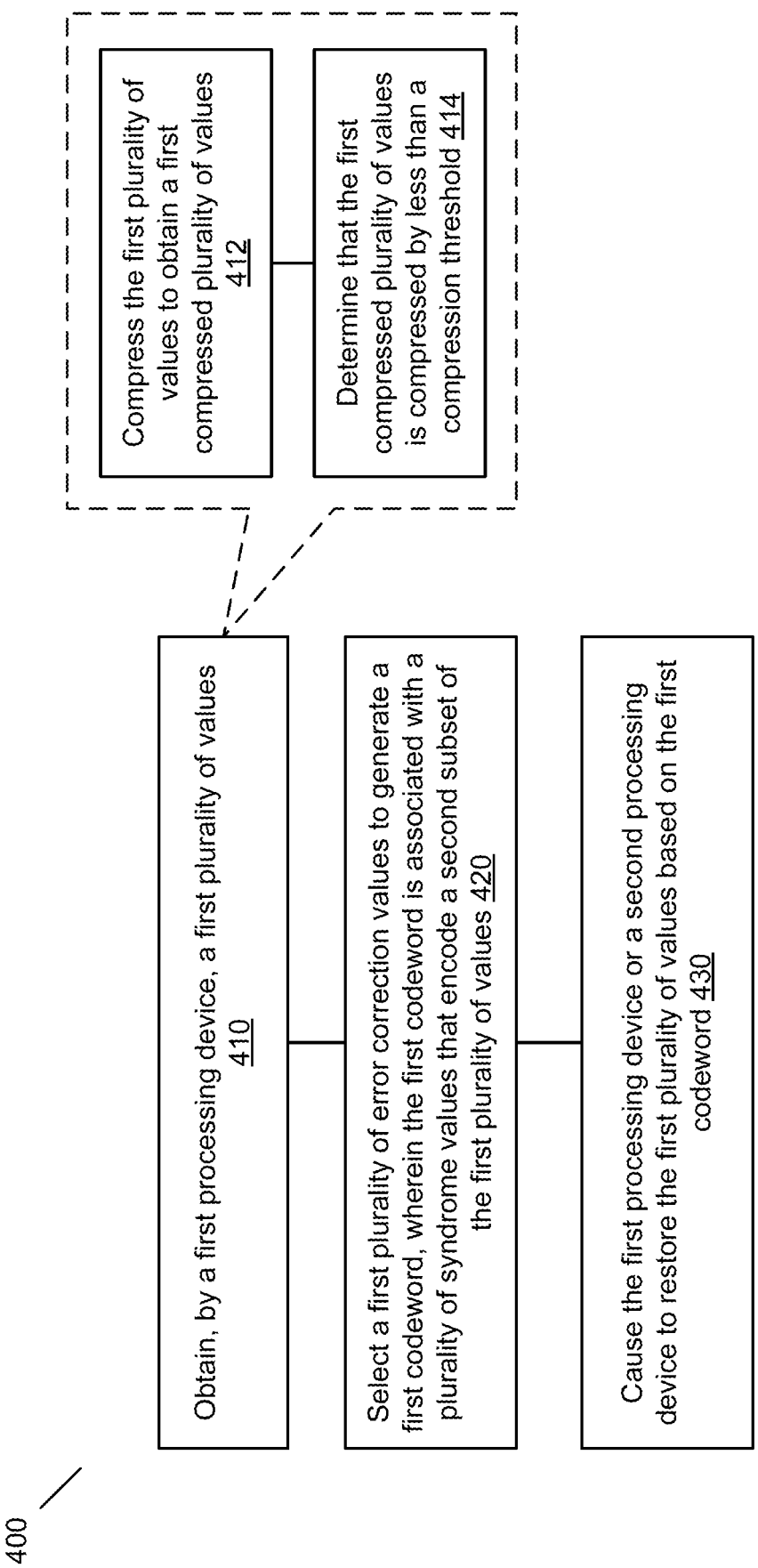
FIG. 4 is a flow diagram illustrating an example method of error correction encoding with additional data encoded via syndrome values, in accordance with some implementations of the present disclosure.
Figure 5:
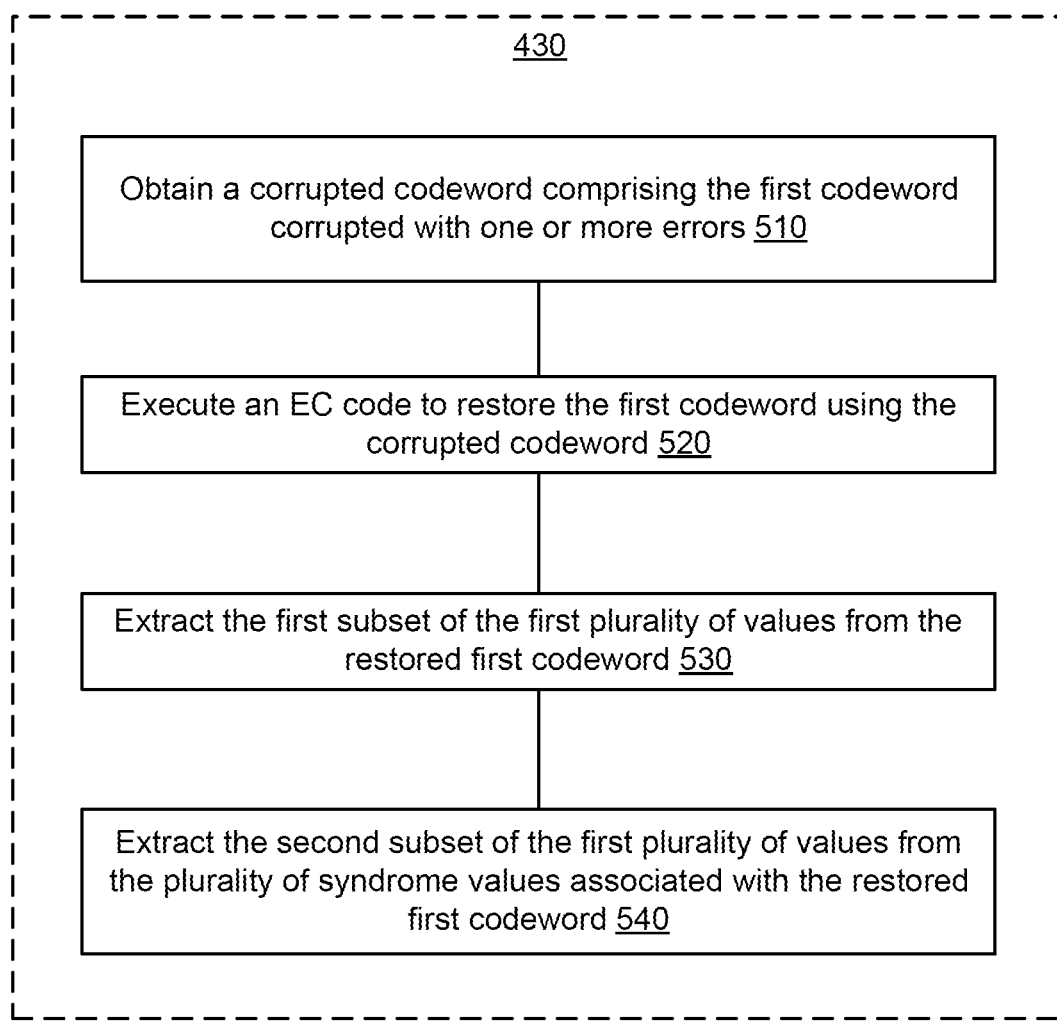
FIG. 5 is a flow diagram illustrating an example method of error correction decoding with additional data extracted from syndrome values, in accordance with some implementations of the present disclosure.

FIGS. 4-5 illustrate example methods 400 and 500 that can be used for generating and decoding data and metadata using error correcting codes. Methods 400 and 500 and each of their individual functions, routines, subroutines, and/or operations may be performed by an error correction engine, such as EC encoder 120 and/or EC decoder 130 in FIG. 1A having dedicated circuits, or a general-purpose processor, such as processor 102 depicted in FIG. 1A. Various blocks of methods 400 and 500 may be performed in a different order compared with the order shown in FIG. 4 and FIG. 5. Some blocks may be performed concurrently with other blocks. Some blocks may be optional. Methods 400 and 500 may be implemented as part of data write and read operations or as part of a network data communication operation. In certain implementations, a single processing thread may perform methods 400 and 500. Alternatively, two or more processing threads may perform methods 400 and 500, each thread executing one or more individual functions, routines, subroutines, or operations of the methods. In an illustrative example, the processing threads implementing methods 400 and 500 may be synchronized (e.g., using semaphores, critical sections, and/or other thread synchronization mechanisms). Alternatively, the processing threads implementing methods 400 and 500 may be executed asynchronously with respect to each other. Various operations of each of methods 400 and 500 may be performed in a different order compared with the order shown in FIGS. 4-5. Some operations of each of methods 400 and 500 may be performed concurrently with other operations. Some operations may be optional.

FIG. 4 is a flow diagram illustrating an example method 400 of generating error correcting codes corresponding to a metadata block, in accordance with some implementations of the present disclosure. In some implementations, method 400 may be performed by EC encoder 120 of FIG. IA. At block 410, processing units performing method 400 may obtain a plurality of values (e.g., values $D_1, \ldots D_k, M_1, M_2 \ldots$). As diagramed in the callout box, obtaining the plurality of values may include, at block 412, compressing the plurality of values to obtain a compressed plurality of values, and determining, at block 414, that the compressed plurality of values is compressed by less than a compression threshold. In some implementations, the first plurality of values may include data (e.g., values $D_1, \ldots D_k$, which may include any number of blocks, bytes, or symbols) and metadata (e.g., one or more blocks, bytes, or symbols $M_1, M_2 \ldots$). If compression of the data and metadata does not decrease the size of the data/metadata by at least the compression threshold (e.g., by at least one block, byte, or symbol, in some implementations), processing units performing method 400 may select, at block 420, a plurality of error correction values (e.g., values $EC_1, \ldots EC_t$) to generate a codeword. The codeword may include a first subset (e.g., values $D_1, \ldots D_k$) of the plurality of values and the plurality of selected EC values (e.g., values $EC_1, \ldots EC_t$). The codeword may be associated with a plurality of syndrome values that (jointly) encode a second subset of the plurality of values (e.g., the metadata, $M_1, M_2$, etc.). For example, the plurality of syndrome values may include each value of the second subset of the plurality of values (e.g., the metadata values, $M_1, M_2$, etc.). In some implementations, the plurality of syndrome values may include one or more zero values, e.g., the first t−1 (t−2, etc.) syndrome values may be zero and the last syndrome value (the last two syndrome values, etc.) may be equal to the metadata values. In some implementations, the metadata may be encoded as any function of multiple syndrome values, e.g., as a linear combination of two or more syndrome values. The processing units performing method 400 may cause, at block 430, the first processing device or a second processing device (e.g., a device that receives the codeword as part of a network communication) to restore the plurality of values (e.g., the data and the metadata) based on the codeword.

FIG. 5 is a flow diagram illustrating an example method 500 of error correction decoding with additional data extracted from syndrome values, in accordance with some implementations of the present disclosure. In some implementations, method 500 may be included as part of method 400, specifically, as part of block 430 of FIG. 4. In some implementations, method 500 may be performed by EC decoder 130 of FIG. 1A. At block 510, processing units performing method 500 may obtain a corrupted codeword that includes the codeword corrupted with one or more errors. The corrupted codeword may be retrieved from a memory storage or received over a network. At block 520, the processing units may continue the method by executing an EC code to restore the codeword using the corrupted codeword. After restoring the codeword, at block 530, the processing units may extract the first subset of the first plurality of values (e.g., the data) from the restored codeword and may extract the second subset of the plurality of values (e.g., the metadata) from the plurality of syndrome values associated with the restored codeword at block 540.

Figure 6:
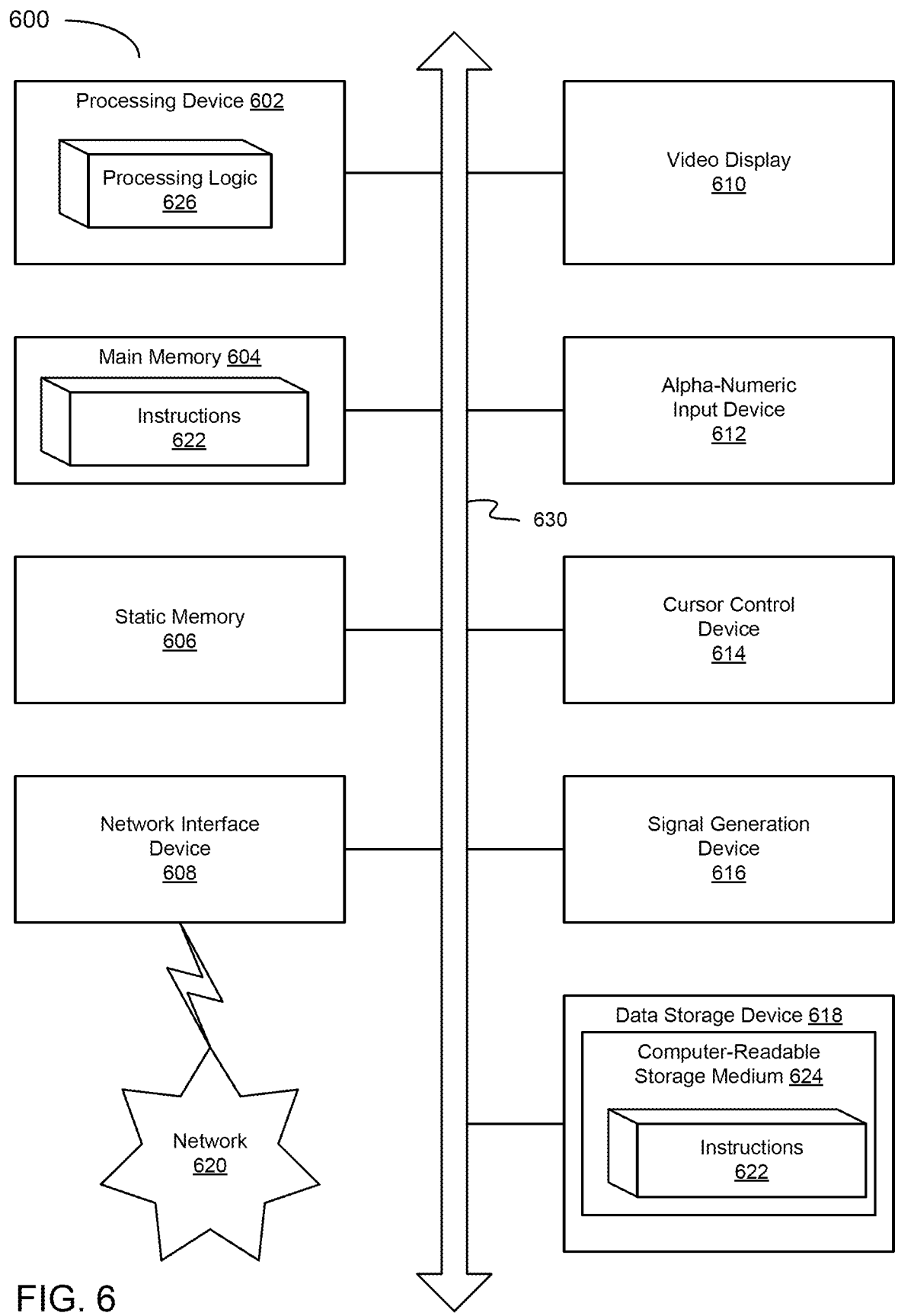
FIG. 6 depicts a block diagram of an example computer system operating in accordance with one or more aspects of the present disclosure.

FIG. 6 depicts an example computer system 600 that can perform any one or more of the methods described herein, in accordance with some implementations of the present disclosure. The computer system may be connected (e.g., networked) to other computer systems in a LAN, an intranet, an extranet, or the Internet. The computer system may operate in the capacity of a server in a client-server network environment. The computer system may be a personal computer (PC), a tablet computer, a set-top box (STB), a Personal Digital Assistant (PDA), a mobile phone, a camera, a video camera, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The exemplary computer system 600 includes a processing device 602, a main memory 604 (e.g., read-only memory (ROM), flash memory, dynamic random access memory (DRAM) such as synchronous DRAM (SDRAM)), a static memory 606 (e.g., flash memory, static random access memory (SRAM)), and a data storage device 618, which communicate with each other via a bus 630.

Processing device 602 (which can include processing logic 626) represents one or more general-purpose processing devices such as a microprocessor, central processing unit, or the like. More particularly, the processing device 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 602 may also be one or more special-purpose processing devices such as an application specific integrated circuit (ASIC), a field programmable gate array (FPGA), a digital signal processor (DSP), network processor, or the like. The processing device 602 is configured to execute instructions 622 for implementing EC encoder 120 and EC decoder 130 of FIG. 1A and to perform the operations discussed herein (e.g., methods 400 and 500 of FIGS. 4-5).

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker). In one illustrative example, the video display unit 610, the alphanumeric input device 612, and the cursor control device 614 may be combined into a single component or device (e.g., an LCD touch screen).

The data storage device 618 may include a computer-readable storage medium 624 on which is stored the instructions 622 embodying any one or more of the methodologies or functions described herein. The instructions 622 may also reside, completely or at least partially, within the main memory 604 and/or within the processing device 602 during execution thereof by the computer system 600, the main memory 604 and the processing device 602 also constituting computer-readable media. In some implementations, the instructions 622 may further be transmitted or received over a network via the network interface device 608.

While the computer-readable storage medium 624 is shown in the illustrative examples to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

Although the operations of the methods herein are shown and described in a particular order, the order of the operations of each method may be altered so that certain operations may be performed in an inverse order or so that certain operations may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "analyzing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general purpose computer selectively activated or reconfigured by a computer program stored in the computer. Such a computer program may be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each operatively coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read-only memory ("ROM"), random access memory ("RAM"), magnetic disk storage media, optical storage media, flash memory devices, etc.).

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation unless described as such. Furthermore, the terms "first," "second," "third," "fourth," etc. as used herein are meant as labels to distinguish among different elements and may not necessarily have an ordinal meaning according to their numerical designation.

Whereas many alterations and modifications of the disclosure will no doubt become apparent to a person of ordinary skill in the art after having read the foregoing description, it is to be understood that any particular implementation shown and described by way of illustration is in no way intended to be considered limiting. Therefore, references to details of various implementations are not intended to limit the scope of the claims, which in themselves recite only those features regarded as the disclosure.

What is claimed is:

1. A method comprising:
    obtaining, by a first processing device, a first plurality of values;
    selecting, by the first processing device, a first plurality of error correction (EC) values to generate a first codeword, wherein the first codeword comprises a first subset of the first plurality of values and the first plurality of EC values, and wherein the first codeword is associated with a plurality of syndrome values that encode a second subset of the first plurality of values; and
    causing the first processing device or a second processing device to restore the first plurality of values based on the first codeword.

2. The method of claim 1, wherein obtaining the first plurality of values comprises:
    compressing the first plurality of values to obtain a first compressed plurality of values; and
    determining that the first compressed plurality of values is compressed, compared with the first plurality of values, by less than a compression threshold.

3. The method of claim 1, wherein the second subset of the first plurality of values comprises metadata associated with the first subset of the first plurality of values.

4. The method of claim 1, wherein the plurality of syndrome values comprises each value of the second subset of the first plurality of values.

5. The method of claim 4, wherein the plurality of syndrome values further comprises one or more zero values.

6. The method of claim 1, further comprising:
    compressing a second plurality of values to obtain a second compressed plurality of values;
    determining that the second compressed plurality of values is compressed, compared with the second plurality of values, by at least a compression threshold;
    selecting a second plurality of EC values to generate a second codeword, wherein the second codeword is associated with syndrome values equal to zero; and
    causing the first processing device or the second processing device to restore the second plurality of values based on the second codeword.

7. The method of claim 6, wherein the first plurality of EC values is selected using a first EC code and the second plurality of EC values is selected using a second EC code, wherein the second EC code is a subcode of the first EC code.

8. The method of claim 1, wherein causing the first processing device or the second processing device to restore the first plurality of values comprises:
    obtaining a corrupted codeword comprising the first codeword corrupted with one or more errors;
    executing an EC code to restore the first codeword using the corrupted codeword;
    extracting the first subset of the first plurality of values from the restored first codeword; and
    extracting the second subset of the first plurality of values from the plurality of syndrome values associated with the restored first codeword.

9. A method comprising:
    obtaining, by a first processing device, a corrupted first codeword comprising a first codeword corrupted with one or more errors, wherein the first codeword comprises a first subset of a first plurality of values and a first plurality of error correction (EC) values;
    executing a first EC code to restore the first codeword using the corrupted first codeword;
    extracting the first subset of the first plurality of values from the restored first codeword; and
    extracting a second subset of the first plurality of values from a plurality of syndrome values associated with the restored first codeword.

10. The method of claim 9, wherein obtaining a corrupted codeword comprises:
    obtaining, by the first processing device or a second processing device, the first plurality of values;
    selecting, by the first processing device or the second processing device, the first plurality of EC values to generate a first codeword, and wherein the first codeword is associated with the plurality of syndrome values that encode the second subset of the first plurality of values;
    performing, by the first processing device or the second processing device, a computer operation that corrupts the first codeword; and
    providing, by the first processing device or the second processing device, to the first processing device the corrupted codeword.

11. The method of claim 10, wherein obtaining the first plurality of values comprises:
    identifying the first plurality of values;
    compressing the first plurality of values to obtain a first compressed plurality of values; and
    determining that the first compressed plurality of values is compressed, compared with the first plurality of values, by less than a compression threshold.

12. The method of claim 10, wherein obtaining a corrupted codeword further comprises:
    compressing a second plurality of values to obtain a second compressed plurality of values;
    determining that the second compressed plurality of values is compressed, compared with the second plurality of values, by at least a compression threshold;

selecting a second plurality of EC values to generate a second codeword, wherein the second codeword is associated with syndrome values equal to zero;

performing, by the first processing device or the second processing device, a computer operation that corrupts the second codeword; and providing, by the first processing device or the second processing device, to the first processing device the corrupted second codeword.

13. The method of claim 12, further comprising:

executing a second EC code to restore the second codeword using the corrupted second codeword;

extracting the second compressed plurality of values from the restored second codeword; and decompressing the second compressed plurality of values to obtain the second plurality of values.

14. The method of claim 13, wherein the first plurality of EC values is selected using the first EC code and the second plurality of EC values is selected using the second EC code, wherein the second EC code is a subcode of the first EC code.

15. The method of claim 10, wherein the computer operation that corrupts the first codeword comprises at least one of:

storing the first codeword in a memory system and reading the first codeword from the memory system; or transmitting the first codeword over a network and receiving the first codeword from the network.

16. The method of claim 9, wherein the second subset of the first plurality of values comprises metadata associated with the first subset of the first plurality of values.

17. The method of claim 9, wherein the plurality of syndrome values comprises each value of the second subset of the first plurality of values.

18. The method of claim 17, wherein the plurality of syndrome values further comprises one or more zero values.

19. A system comprising:

a memory system; and one or more processing units operatively coupled to the memory system, the one or more processing units to:

obtain a plurality of values;

select a plurality of error correction (EC) values to generate a codeword, wherein the codeword comprises a first subset of the plurality of values and the plurality of EC values, and wherein the codeword is associated with a plurality of syndrome values that encode a second subset of the plurality of values; and cause the one or more processing units of the system or a processing unit of a second system to restore the plurality of values based on the codeword.

20. The system of claim 19, wherein to cause the one or more processing units of the system or the processing unit of the second system to restore the plurality of values based on the codeword, the one or more processing units further to:

obtain a corrupted codeword comprising the codeword corrupted with one or more errors;

execute an EC code to restore the codeword using the corrupted codeword; extract the first subset of the plurality of values from the restored codeword; and extract the second subset of the plurality of values from the plurality of syndrome values associated with the restored codeword.

* * * * *